United States Patent [19]
Mangat et al.

[11] Patent Number: 5,989,760
[45] Date of Patent: Nov. 23, 1999

[54] METHOD OF PROCESSING A SUBSTRATE UTILIZING SPECIFIC CHUCK

[75] Inventors: Pawitter Jit Singh Mangat, Chandler; William Joseph Dauksher, Mesa, both of Ariz.

[73] Assignee: Motorola, Inc., Schaumburg, Ill.

[21] Appl. No.: 09/040,471

[22] Filed: Mar. 18, 1998

[51] Int. Cl.$^6$ ........................................................ G03F 9/00
[52] U.S. Cl. ............................ 430/22; 430/296; 430/942; 430/966; 279/3
[58] Field of Search .................................. 279/3; 430/22, 430/296, 942, 966

[56] References Cited

U.S. PATENT DOCUMENTS

| | | | |
|---|---|---|---|
| 4,357,006 | 11/1982 | Hayes | 279/3 |
| 4,603,867 | 8/1986 | Babb et al. | 279/3 |
| 5,632,854 | 5/1997 | Mirza et al. | 438/53 |

OTHER PUBLICATIONS

J.A Liddle et al., "Mask fabrication for projection electron– beam lithography incorporating the Scalpel technique", J. Vac. Sci. Technol. B, vol.9, No. 6, Nov./Dec. 1991.

S.D. Berger et al., "Projection electron–beam lithography: A new approach", J. Vac. Sci. Technol. B, vol.9, No. 6, Nov./Dec. 1991.

*Primary Examiner*—Christopher G. Young
*Attorney, Agent, or Firm*—George R. Meyer

[57] ABSTRACT

A substrate (10) having a central region (32) and a peripheral region (34) is processed using a chuck (40) that contacts peripheral regions (34) of the substrate but not the central region. A fabrication step is performed while the substrate (10) is on the chuck (40, 60, 70). The chuck can be used in the formation of a lithographic mask or a semiconductor device.

20 Claims, 3 Drawing Sheets

5,989,760

METHOD OF PROCESSING A SUBSTRATE UTILIZING SPECIFIC CHUCK

FIELD OF THE INVENTION

This invention relates in general to methods of processing substrates, and more particularly, methods of processing substrates that have features formed within a central region of the substrates.

BACKGROUND OF THE INVENTION

The semiconductor industry is requiring smaller dimensions to make state-of-the-art semiconductor devices. In forming these devices, the limits of optical lithographic techniques are fast approaching. Other advanced lithographic techniques are being investigated to replace optical lithography once resolution and depth of focus limits of the optical lithography tools are reached. One lithographic technique that is being investigated is projection electron beam lithography. One specific implementation is called scattering with angular limitation in project electron beam (E-beam) lithography, which is also called SCALPEL.

FIG. 1 is a cross sectional depiction of a mask used for SCALPEL. The mask 10 is made from a membrane layer 12 formed overlying a substrate 14. Typically, the membrane layer 12 is silicon nitride and the substrate 14 is a silicon wafer. On one side of the mask, scattering elements 16 are formed on the membrane layer 12. On the other side of the mask, portions of the membrane layer 12 and substrate 14 are removed to form struts.

FIG. 2 is an enlarged view of a portion of the mask 10 illustrated in FIG. 1. Portions of the membrane layer 12 lying between the struts 18 form the membranes 17. The scattering elements 16 are located over the membranes 17. The scattering elements 16 and struts 18 are formed on opposite sides of the mask 10. The struts 18 include remaining portions of the silicon wafer 14 and membrane layer 12 after a membrane formation step. The scattering elements 16 can be formed before or after the membranes 17 are formed.

One problem in manufacturing the SCALPEL mask is the formation of features (struts 18 and scattering elements 16) on alternate sides of the mask 10. Typically, the struts are first defined by the nitride layer on one side of the mask 10. During subsequent processes, scattering elements 16 are formed on the opposite side of the mask 10. The substrate 14 is then etched to finish the formation of the struts 18. Alternately processing the mask 10 on different sides of the mask 10 increases its potential for introducing handling and processing induced defects. Handling is generally performed using handling devices, such as tweezers, vacuum wands, or automated equipment. However, it should be noted that during transport, handling, and processing, these handling devices should not contact the scattering elements 16 or the struts 18. Processing sequences that form the scattering elements 16 before completely forming the struts 18 have a potential to create a pattern distortion of the scattering elements 16 that occurs due to etching the substrate 14. The exact mask fabrication sequence, patterning the scatterer before membrane formation or patterning the scatterer after membrane formation is still a matter of debate. However, processing and handling considerations must be addressed in order to accurately produce the scattering elements 16 on the SCALPEL mask 10.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

Figure 1:
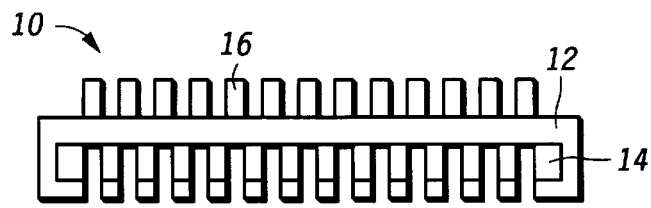
FIG. 1 includes an illustration of a cross sectional view of a SCALPEL mask (prior art)
Figure 2:
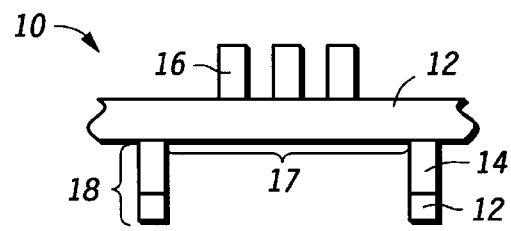
FIG. 2 includes an illustration of an enlarged view of the mask of FIG. 1 illustrating the placement of scattering elements in relationship to the struts. (prior art)
Figure 3:
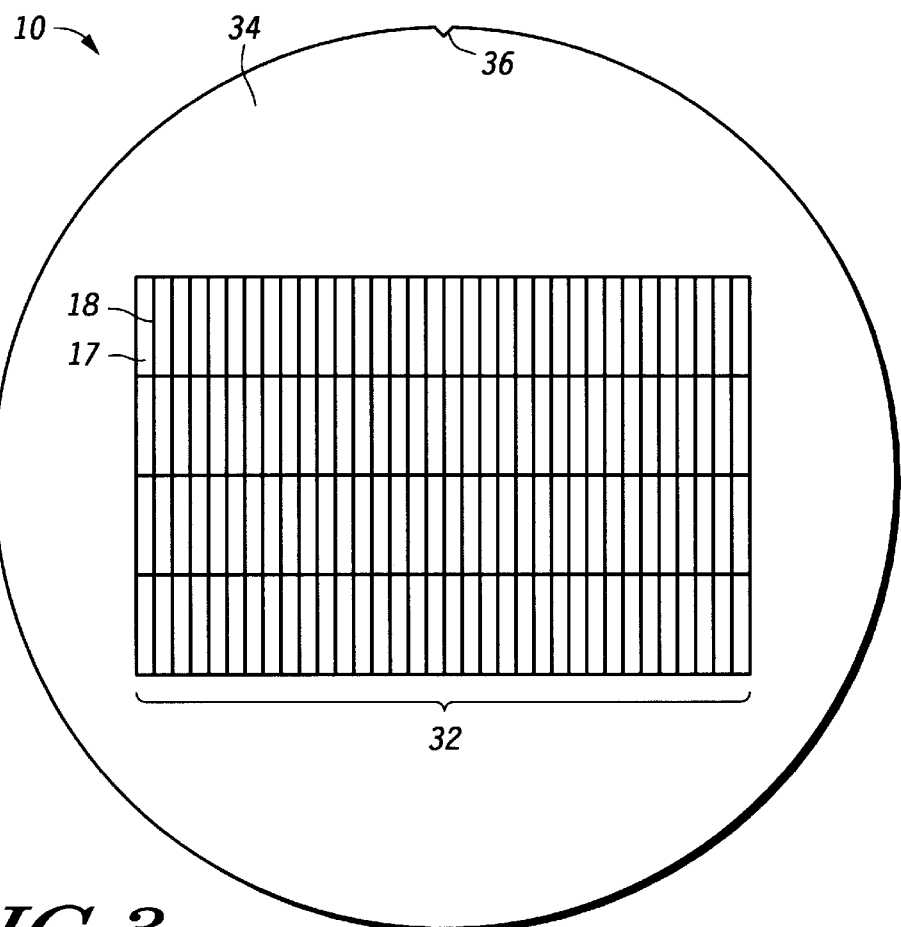
FIG. 3 includes an illustration of a top view of a SCALPEL mask formed in accordance with one embodiment of the present invention.

FIG. 3 includes an illustration of the mask 10 that includes the struts 18, a membrane array 32 (center region), and peripheral regions 34 which are those portions of the mask outside the membrane array 32. Included within the membrane array 32, are struts 18 and membranes 17. The struts 18 are represented by the grid of horizontal and vertical lines within the membrane array 32. Additionally, the mask 10 includes an alignment feature 36 for aligning the mask to various lithography tools both for the manufacturing of the mask and also for the placement of the mask within an E-beam lithography tool. It should be noted that other alignment features can be used to improve alignment accuracy.

Figure 4:
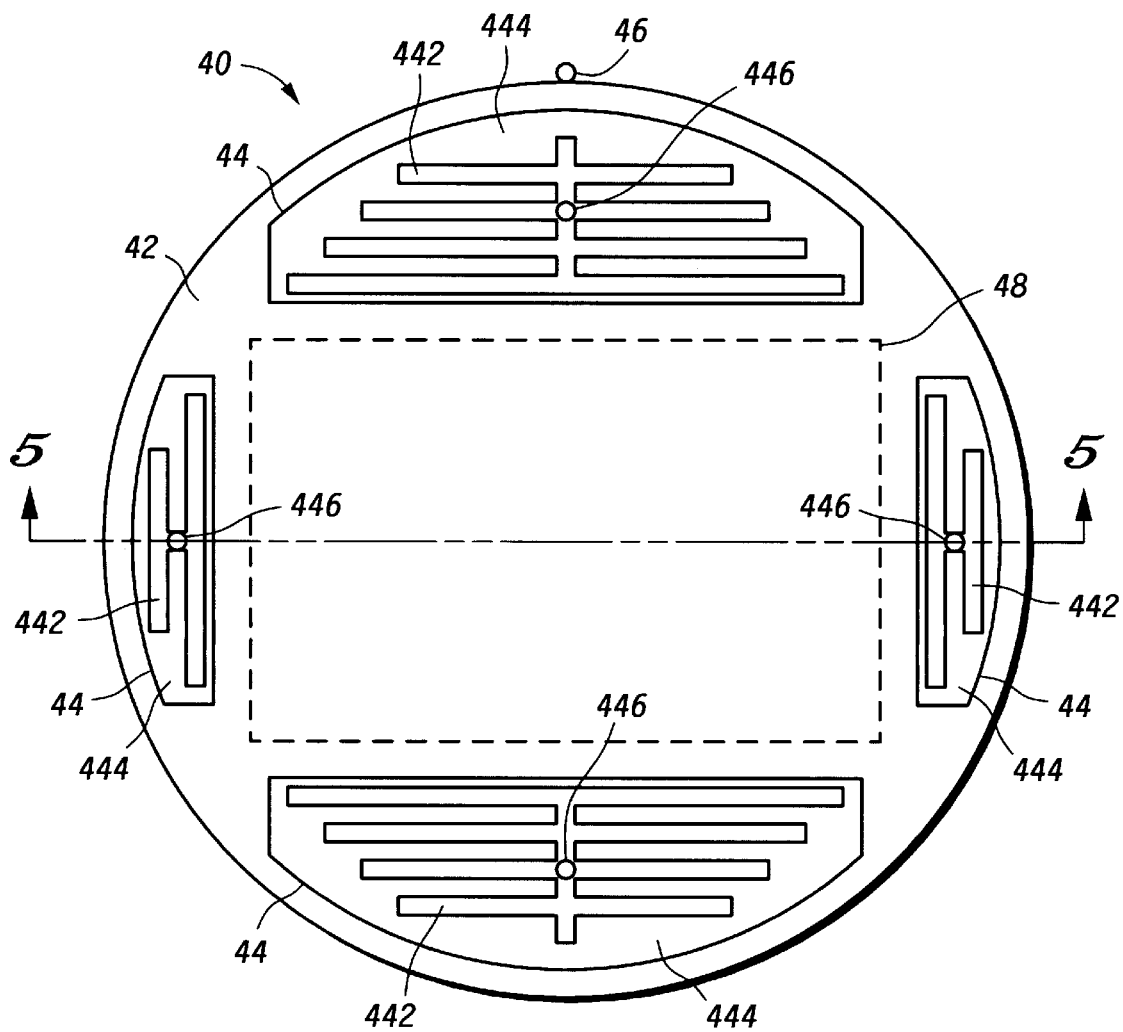
FIG. 4 includes an illustration of a top view of a chuck used for processing substrates in accordance with an embodiment of the present invention.

FIG. 4 includes a chuck 40 that is used in forming a mask for the SCALPEL technology. The chuck 40 includes a base 42 and substrate holders 44 arranged near the outer edges of the chuck 40. The substrate holders 44 include vacuum grooves 442 and vacuum blocks 444 that are the solid material that defines the vacuum grooves 442. Within the substrate holders 44 are vacuum ports 446 for holding the mask 10 onto the substrate holder during processing or transport. This embodiment uses a vacuum source as the preferred method of securing the mask 10 to the chuck 40, however alternative methods of securing the mask 10 to the chuck 40 can also include using an electrostatic potential or mechanical clamps. Also illustrated in FIG. 4 is a non-contact area 48 which is the complement of the membrane array 32 shown in FIG. 3. More specifically, the non-contact area 48 prevents the chuck 40 from contacting any portion of the membrane array 32.

The substrate holders 44 and the base 42 can be formed with as little as one material. In one particular embodiment, the substrate holders 44 are made of four different pieces of material that are appropriately machined as illustrated in FIG. 4 and then are subsequently attached to the base 42. The attachment may occur by screws, rivets, glue, or any other means that can achieve attachment between the base 42 and the substrate holders 44 while still maintaining planarity requirements that will be discussed. The chuck 40 also includes an alignment feature 46 which is used for aligning the mask 10 to chuck 40.

One of the dimensions that may be of interest with FIG. 4 is the distance between the substrate holders 44 and the membrane array 32 after the substrate 10 is placed onto the chuck 40. The location of the membrane array 32 should correspond with the location of the non-contact area 48 illustrated in FIG. 4. The minimum distance between non-contact area 48 and the edge of the substrate holders 44 closest to the non-contact area 48 should not be less than approximately one millimeter. The substrate holders 44 illustrated in FIG. 4 have arc segment shapes. These can be replaced by nearly any geometric shape, such as circles, polygons, triangles, rectangles, etc.

Figure 5:
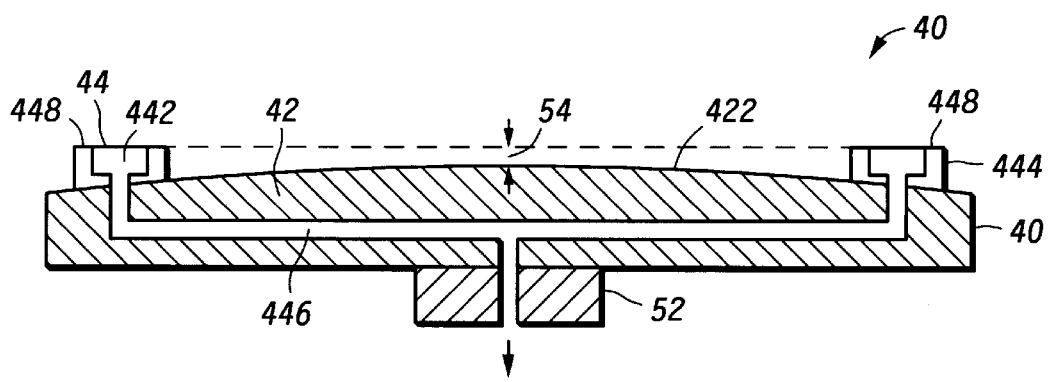
FIG. 5 includes an illustration of a cross sectional view of the chuck illustrated in FIG. 4.

FIG. 5 includes an illustration of a cross-sectional view of the chuck 40. The chuck 40 includes a base 42 with a curved surface 422. The curved surface 422 allows resist or other chemicals that may reach the surface of the base 42 to move away from the center and be removed from the chuck 40 as it rotates. The chuck 40 may be used for other applications beyond coating liquids, such as resist. As can be seen in FIG. 5 the substrate holders 44 are attached to the base 42 near the edges of the chuck 40. The vacuum grooves 442 are connected to a vacuum port 446. The chuck further includes an adapter 52 which enables the chuck to be coupled to existing tools, for coating resist, film depositions or the like. The vacuum blocks 444 have substantially planar surfaces 448. When fabricating the mask 10, the mask is placed over the planar surfaces 448 and lies over the curved surface 422. Near the center of the chuck there is minimum gap 54 that is the distance between the bottom of the mask 10 and the top of the curved surface 422. In various embodiments of the invention the gap is typically in a range of approximately 0–10 millimeters. It the gap 54 is zero, the mask 10 contacts the curved surface 422. More typically, the gap is in a range of approximately 2–3 millimeters.

The planar surfaces 448 are never perfectly level with one another and have some deviation. Among all the planar surfaces 448, the difference between the highest and the lowest points along those surfaces should not exceed approximately 30 microns. Typically, in order to achieve good uniformity during depositions or coatings, this should be kept less than approximately 10 microns.

Figure 6:
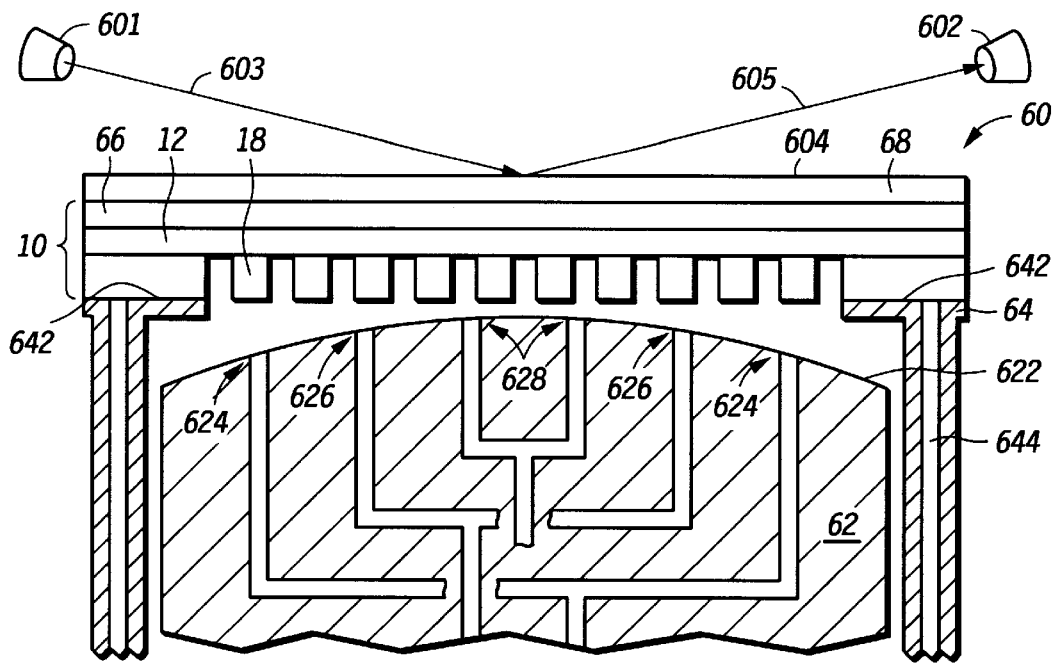
FIG. 6 includes an illustration of a cross sectional view of a portion of an alternate embodiment of the chuck.

An alternate embodiment of the chuck system is illustrated in FIG. 6. In FIG. 6 the chuck 60 includes a stationary base 62 and a rotational stage 64. The stationary base 62 has a curved surface 622. In other embodiments, the curved surface 622 can be replaced by other types of surfaces, such as flat, conical, etc. Ports 624, 626, and 628 are located along the surface 622 and are regularly distributed along the stationary base 62. The ports for 628 are spaced relatively equally away from the center point of the mask 10. Likewise, the ports 624 and 626 are spaced in equal distance from the center point of the mask. These ports can be used to furnish a positive or negative pressure in relation to the substrate 10 to control substrate surface planarity during a resist coat or various other processing operations.

Referring to the illustration in FIG. 6, the mask 10 is mounted onto a rotational stage 64 having planar surfaces 642. A vacuum port 644 similar to those shown in the previous embodiments is used to hold the substrate 10 against the rotational stage 64 while it is moving. The mask 10 includes the membrane layer 12 and struts 18. At this point in the process, a scattering layer 66 has been formed but has not yet been patterned. A resist layer 68 is then coated over the scattering layer 66 using the chuck 60. While rotating this stage 64, independent pressure control of the ports 624, 626, and 628 is adjusted to keep the substrate 10 as flat as possible, which in turn allows the resist layer 68 to be coated uniformly during the coating operation.

The ports within the stationary base 62 are regularly distributed throughout and may take a pattern of a linear string of ports from the center to the edge or could also be concentric rings of ports relative to the center of the stationary base 62. The concept of the ports and independent control of the pressure across the mask can also be utilized in the embodiment illustrated in FIG. 4. This configuration may also provide a more effective means of clamping substrates that are warped.

This embodiment can be modified to use an optical sensor network in conjunction with ports 624, 626, and 628, to detect substrate 10 contour changes as a means of further controlling resist formation conditions. An optical transmitter 601 and receiver 602 are placed over the mask 10. The transmitter 601 emits a source signal 603 that is reflected off of the mask surface 604. The reflected signal 605 is then measured by the receiver 602. The intensity of reflected signal is correlated to surface contour changes. The reflected signal is used in conjunction with other resist formation control variables, such as spin speed and dispense amount, to control response variable outputs such as resist thickness or resist uniformity. Specifically, the ports 624, 626, and 628 can be used to control the pressure of the side of the substrate 10 having the struts 18. The pressure may be a positive pressure or a negative pressure compared to the ambient adjacent the other side of the substrate 10. This configuration of the system can be achieved with current technology using conventional methods.

While embodiments of the present invention have focused on making a mask having fragile membranes, alternate embodiments can be used for semiconductor device substrates. The chucks 40 and 60 may be particularly useful for substrates that have significant processing steps on both sides. The chucks 40 and 60 may be used in performing a variety of semiconductor device processing steps including lithography, etch, ash and film depositions. Solid state pressure sensors are an example of a semiconductor device particularly well suited for use with chuck 40 or 60.

Figure 7:
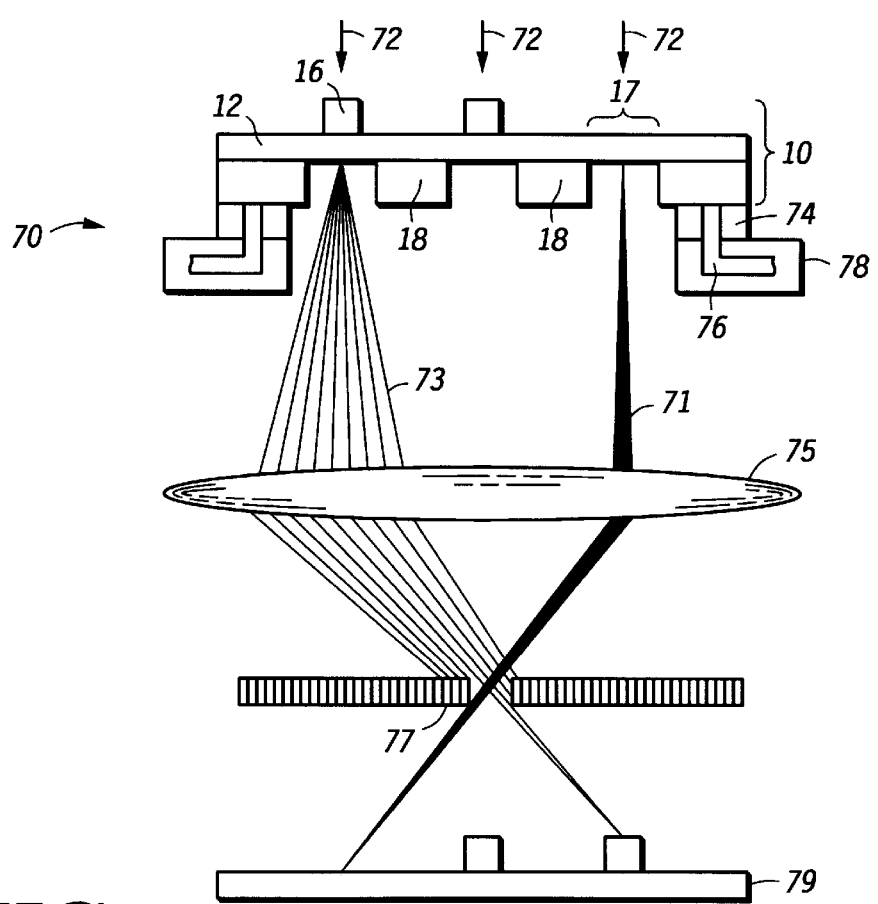
FIG. 7 includes an illustration of an E-beam projection system including a mask with a mask holder within the system.

A modified version of the chuck assembly 40 can be used as a mask holder in a projection E-beam lithography tool 70 as illustrated in FIG. 7. Electron beams (radiation), as illustrated with arrows 72, are directed toward the mask 10. The mask 10 is held in place by vacuum chuck 74 that is attached to a positioning chuck 78. The mask 10 is held onto the chuck 74 by vacuum ports 76. The mask itself includes the struts 18, membranes 17 and scattering elements 16 over the membranes 17 as previously described. During alignment of the mask 10, the positioning chuck 78 can be moved in various directions to allow the mask 10 to be aligned to the semiconductor device substrate 79. In another embodiment, the semiconductor device substrate 79 can be placed on a stage (not shown in FIG. 7), which can be moved in various directions to allow the semiconductor device substrate to be aligned to the mask. The stage used to hold the semiconductor device substrate (not shown in FIG. 7), can be configured using the same basic design as chuck 40 or 60.

Returning to FIG. 7, radiation 72 passes relatively unobstructed through the membranes 17 where scattering elements 16 are not present as illustrated by the unscattered electron beam 71. If scattering elements are present, the radiation 72 becomes dispersed as illustrated by scattered electron beam 73. These beams are then focused through lens 75 and an aperture 77 before reaching the semiconductor device substrate. The unscattered electron beam 71 passes through the lens 75 and the aperture 77 relatively unobstructed to expose the resist layer coated over the semiconductor substrate 70. The scattered electron beam 73 passes through the lens 75. However, only a small portion of the scattered electron beam 73 is capable of passing through aperture 77 and does not substantially expose the resist layer thereon. This results in the formation of high-contrast images on the semiconductor device substrate 79.

Embodiments of the present invention have benefits over the prior art. First, the chucks 40 and 60 and their use are well suited for substrates that are processed on both sides. In the case of mask fabrication, the wafer is handled only at peripheral regions 34 of the substrate 10. For the e-beam mask, the membrane array 32 or high resolution scattering elements are put at significantly lower risk when chucks 40 or 60 are used. Second, chuck 40 and 60 allow the manufacturing process to be modified allowing the membrane array to be formed earlier in the process without subjecting it to serious jeopardy. Interactions between the membranes 17 and other surfaces during processing are minimized as a result of the design of chuck 40 and 60. This allows the scattering pattern to be formed later, thus reducing distortion. It also helps in that a number of blank masks can be prepared in advance of their required patterns thus reducing turn around time from the time a mask shop receives a mask order until the time the customer receives a finished mask. The applications of these masks are not limited to only E-beam lithography. X-ray and ion beam masks are also candidates for manufacture using this method.

Another benefit of the present invention is that it allows additional control when forming the resist layer 68. Ports 624, 626 and 628 can be used to control the substrate surface contour to optimize resist thickness and uniformity.

Additionally, no protective layers are required in forming the layers. This allows fewer steps to be performed and reduces the turn around time as well as defects on the substrate. It is believed that embodiments of the present invention will increase yield and will also enable use of larger diameter substrates to form masks.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method for processing a substrate comprising the steps of:

placing the substrate on a chuck, wherein:
    the substrate has an edge, a central region, and a peripheral region; the peripheral region lies closer to the edge compared to the central region;
    the chuck includes at least one substrate holder, wherein each of the at least one substrate holder consists of a single piece;
    the substrate holder contacts the peripheral region of the substrate but not the central region;
    the substrate contacts only those portions of the chuck that include the at least one substrate holder consisting of a single piece; and performing a fabrication step using the substrate, wherein this step is performed while the substrate is on the substrate chuck.

2. The method of claim 1, wherein the fabrication step is a semiconductor device substrate fabrication step.

3. The method of claim 1, wherein the substrate includes a mask used during a lithographic process.

4. The method of claim 3, wherein the lithographic process includes an electron beam lithographic process.

5. The method of claim 3, wherein the lithographic process is selected from a group consisting of an x-ray and an ion beam lithographic process.

6. The method of claim 1, wherein the substrate chuck is used to hold the substrate during a resist forming step.

7. The method of claim 6, wherein a portion of the substrate chuck under the substrate and between substrate holders is shaped so as to promote a drainage of processing chemicals away from a center of the substrate chuck during the resist forming step.

8. The method of claim 1, wherein the step of performing comprises a step of controlling a pressure of an area adjacent at least one side of the substrate to control a planarity of the substrate.

9. The method of claim 1, wherein the substrate chuck is used to hold the substrate during an etch step.

10. The method of claim 1, wherein the substrate chuck is used to hold the substrate during a film deposition step.

11. The method of claim 1, further comprising a step of applying a first force to control a position of the substrate, wherein the first force is selected from a group consisting of a vacuum and an electrostatic potential.

12. The method of claim 11, further comprising a step of applying a second force to compensate for a substrate surface contour, wherein the substrate surface contour is selected from a group of a substrate warpage and a deflection of membranes.

13. The method of claim 1, further comprising a step of using mechanical clamps to control a position of the substrate.

14. The method of claim 1, wherein during the step of placing the substrate on a substrate chuck, the substrate holding surface has a first point that is a closest point to the central region, wherein a distance between the first point and the central region is at least approximately one millimeter.

15. The method of claim 1, wherein each of the at least one substrate holder has a substantially planar surface and the substantially planar surface contacts the substrate.

16. A method of processing a semiconductor device substrate comprising the steps of:

placing the semiconductor device substrate into a lithography tool having a mask, wherein the semiconductor device substrate has a resist layer;

aligning the semiconductor device substrate to the mask by moving at least one of the semiconductor device substrate and the mask relative to each other, wherein:
    the at least one of the semiconductor device substrate and the mask has an edge, a central region, and a peripheral region that lies closer the edge compared to the central region;
    a position of the at least one of the semiconductor device substrate and the mask is controlled using a chuck, wherein the chuck includes at least one holder, and wherein each of the at least one holder consists of a single piece;

the chuck contacts the peripheral region but does not contact the central region of the at least one of the semiconductor device substrate and the mask;

the at least one of the semiconductor device substrate and the mask contacts only those portions of the chuck that include the at least one holder consisting of a single piece; and selectively exposing the resist layer using the mask; and removing the semiconductor device substrate from the lithography tool after the step of selectively exposing.

17. The method of claim 16, further comprising a step of applying a force to control the position of the at least one of the semiconductor device substrate and the mask, wherein the force is selected from a group consisting of a vacuum and an electrostatic potential.

18. The method of claim 16, further comprising a step of applying a second force to compensate for a substrate surface contour change, wherein the substrate surface contour change is selected from the group of a substrate warpage or a deflection of membranes.

19. The method of claim 16, wherein the step of selectively exposing includes an electron beam lithographic process.

20. The method of claim 16 wherein the step of selectively exposing is selected from a group consisting of an x-ray or an ion beam lithographic process.

* * * * *